US006593974B1

United States Patent
Brilka et al.

(10) Patent No.: US 6,593,974 B1
(45) Date of Patent: Jul. 15, 2003

(54) CIRCUIT ARRANGEMENT FOR DEMODULATING AN INTERMEDIATE-FREQUENCY VIDEO SIGNAL

(75) Inventors: Joachim Brilka, Hamburg (DE); Thomas Hafemeister, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 473 days.

(21) Appl. No.: 09/684,553

(22) Filed: Oct. 6, 2000

(30) Foreign Application Priority Data

Oct. 9, 1999 (DE) .......................... 199 48 745

(51) Int. Cl.[7] .............................................. H04N 5/455
(52) U.S. Cl. ........................................ 348/726; 348/725
(58) Field of Search ................................ 348/726, 727, 348/725, 731, 735, 737; 375/327, 328, 338, 339, 344; 455/337; H04N 5/455

(56) References Cited

U.S. PATENT DOCUMENTS

| | | | |
|---|---|---|---|
| 5,438,594 A | * 8/1995 | Podolak | 375/332 |
| 5,737,694 A | * 4/1998 | McMahill et al. | 455/76 |
| 5,857,004 A | * 1/1999 | Abe | 375/344 |
| 6,147,713 A | * 11/2000 | Robbins et al. | 348/555 |

OTHER PUBLICATIONS

"Phase–Lock Techniques", by Floyd D. Gardner, John Wiley and Sons, Ltd. pp. 218–223.

* cited by examiner

*Primary Examiner*—Michael Lee
(74) *Attorney, Agent, or Firm*—Steven R. Biren

(57) ABSTRACT

A circuit arrangement for demodulating an intermediate-frequency video signal, comprising a video demodulator (1) and a phase-locked loop (5) formed as a Costas loop, in which an output signal of a controllable oscillator (12) arranged in the Costas loop and the intermediate frequency video signal are coupled to the video demodulator (1), should always supply a demodulated video signal of a predetermined polarity, independent of overmodulation occurring in the intermediate-frequency video signal. To this end, this circuit arrangement is characterized in that a polarity inverter (2) is provided, which is preceded by the video demodulator 1 and by means of which the polarity of the demodulated video signal is invertable in dependence upon a control signal supplied by a polarity detector (3), and in that the polarity detector (3) determines the polarity of the output signal of the video demodulator (1) or of the polarity inverter (2) and, in dependence upon the determined polarity, controls the polarity inverter (2) by means of the control signal in such a way that the demodulated video signal at the output of the polarity inverter (2) has a predetermined polarity.

10 Claims, 3 Drawing Sheets

CIRCUIT ARRANGEMENT FOR DEMODULATING AN INTERMEDIATE-FREQUENCY VIDEO SIGNAL

BACKGROUND OF THE INVENTION

The invention relates to a circuit arrangement for demodulating an intermediate-frequency video signal, comprising a video demodulator and a phase-locked loop formed as a Costas loop, in which an output signal of a controllable oscillator arranged in the Costas loop and the intermediate frequency video signal are coupled to the video demodulator.

Circuit arrangements for demodulating IF video signals generally comprise a PLL for regaining the modulation frequency in the correct phase position. Conventional PLLs, all of which have a stable working point only every 360°, react to overmodulation of the amplitude-modulated television picture carrier with a phase jump of 180°. Due to this phase variation, the synchronous relation between the phase of the signal supplied by the PLL and the demodulator is subject to transient disturbances. Picture disturbances then occur.

It is further known that a Costas loop is used as a PLL for such demodulators, which loop is characterized in that it has stable working points at every 180°. When there is overmodulation in an IF video signal, the Costas loop can consequently lock in on the carrier phase then occurring in an inverted form, i.e. on the carrier phase of the picture carrier which has changed 180° in phase. Thus, the above-described transient disturbances do not occur. However, another problem occurs, which is caused by the working points which are stable at every 180°. This problem is that, when the Costas loop locks in due to its stable working points at every 180°, a coincidental lock-in on one of two stable states at every 180° is possible. When using a Costas loop in such a modulator, it is therefore not known in advance at which polarity the demodulated video signal occurs. Costas loops are known per se from the publication "Phase-Lock Techniques" by Floyd M. Gardner, published by John Wiley & Sons. p. 221, particularly FIG. 11.6.

SUMMARY OF THE INVENTION

It is an object of the invention to provide a circuit arrangement of the type described in the opening paragraph with a Costas loop, which supplies the demodulated video signal always in a desired polarity.

According to the invention, this object is solved in that a polarity inverter is provided, which is preceded by the video demodulator and by means of which the polarity of the demodulated video signal is invertable in dependence upon a control signal supplied by a polarity detector, and in that the polarity detector determines the polarity of the output signal of the video demodulator or of the polarity inverter and, in dependence upon the determined polarity, controls the polarity inverter by means of the control signal in such a way that the demodulated video signal at the output of the polarity inverter has a predetermined polarity.

The circuit arrangement for demodulating an IF video signal comprises a polarity inverter. It is preceded by the video demodulator and allows inversion of the polarity of the demodulated video signal supplied by the video demodulator. Basically, a desired polarity of the demodulated video signal can be realized by means of this polarity inverter.

To this end, the polarity inverter is controlled by means of a control signal which is supplied by a polarity detector.

The polarity detector determines the polarity of the output signal of either the video demodulator or of the polarity inverter and controls the polarity inverter in dependence upon this determined polarity in such a way that the demodulated video signal at the output of the polarity inverter has a predetermined polarity.

A fundamental idea of the invention thus is to determine the actual polarity of the demodulated video signal and, in dependence upon this determined polarity, to control the polarity inverter in such a way that the demodulated video signal occurs with the desired polarity at the output of the circuit arrangement.

It is thereby ensured that the desired polarity occurs under all operating conditions of the circuit arrangement.

When there is overmodulation in the video signal and a resultant phase jump in the picture carrier at the output of the circuit arrangement, the demodulated video signal will neither be disturbed, nor will its polarity be inverted. Moreover, it makes no difference in the circuit arrangement according to the invention on which of the two 180° phase-shifted working points the Costas loop locks in; the circuit arrangement will still always supply the video signal in the desired polarity.

An embodiment of the invention as defined in claim 2 has the particular advantage that a kind of feedback solution is possible when the polarity detector determines the polarity of the output signal of the polarity inverter (and not that of the output signal of the demodulator), in which solution the state of the control signal must be triggered only once in the polarity detector when the unwanted polarity of the demodulated video signal occurs, because the video signal will then occur in the correct, desired polarity at the output of the polarity inverter by virtue of the triggered change-over of this polarity inverter.

In accordance with a further embodiment as defined in claim 3, the circuit arrangement is advantageously formed in such a way that the demodulated video signal occurs with a negative polarity. In known circuit arrangements, the demodulated video signal is customarily processed in this polarity.

In accordance with a further embodiment of the invention as defined in claim 4, the above-described one-time reaction of the polarity detector upon occurrence of an unwanted polarity may advantageously be achieved by means of a comparator and a D-flipflop. When the value of the video signal applied to the comparator exceeds the value of a comparison signal, this comparator supplies a corresponding pulse to the D-flipflop. In response to this pulse, the D-flipflop changes its switching state and the control signal thus changes its state. Thereupon, the polarity inverter changes over and the demodulated video signal further occurs with the desired polarity after the polarity inverter. Consequently, the comparator subsequently does not trigger a switching pulse anymore.

The comparison voltage as defined in claim 5 advantageously has half the value of the voltage occurring in the video signal at maximum modulation. This applies both to positive and to negative polarities.

For multi-standard television receivers, in which it is generally determined or predetermined anyway which type of modulation is associated with the IF video signal, this modulation-type signal may advantageously also be used, as defined in claim 7, for the purpose of informing the polarity detector of the type of modulation and controlling the polarity inverter in a corresponding way. It can thereby be achieved that the circuit arrangement always has, for example, a demodulated video signal of a negative polarity, both in the case of negative modulation and in the case of positive modulation. This is a further essential advantage of the circuit arrangement according to the invention, because, in addition to the above-described advantages, it can also be used in this way to change the polarity of a television signal when it changes its polarity on the basis of positive or negative modulation. Also this polarity change can be suppressed by the circuit arrangement according to the invention.

For this purpose, the measures as defined in claim 8 are taken in a further embodiment of the invention. In accordance with the type of modulation of a video signal, the switchable inverter can invert or not invert the polarity of the demodulated video signal applied to the polarity detector. As a result, the polarity detector switches the polarity inverter always in such a way that the demodulated video signal appears in a fixed, desired polarity at its output, which is independent of the modulation type of the IF video signal.

Moreover, a DC position of the demodulated video signal, varying in accordance with the type of modulation, is compensated by means of the video amplifier.

In accordance with a further embodiment of the invention as defined in claim 9, there is an alternative possibility of changing the comparison voltage of the comparator in dependence upon the modulation type of the IF video signal, instead of changing the switchable inverter.

These and other aspects of the invention are apparent from and will be elucidated with reference to the embodiments described hereinafter.

DESCRIPTION OF THE PREFERRED EMBODIMENTS

Figure 1:
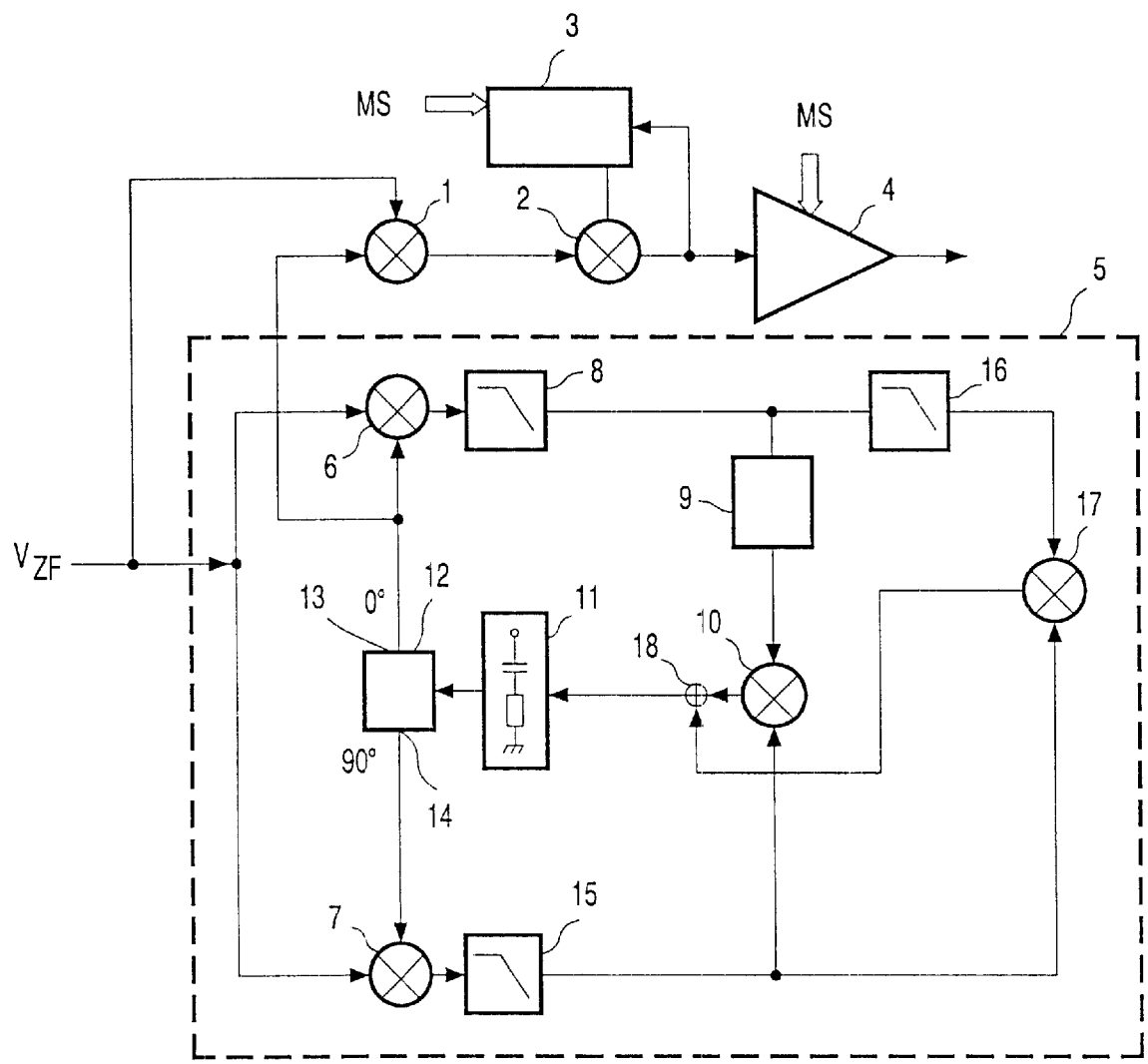
FIG. 1 is a block diagram of a circuit arrangement according to the invention for demodulating an IF video signal, comprising a Costas loop.

FIG. 1 is a block diagram of a circuit arrangement according to the invention for demodulating an IF video signal, comprising a video demodulator 1 which receives the IF video signal $V_{ZF}$. The video demodulator 1 receives the modulation frequency and the oscillator frequency from a Costas loop 5, to be further described hereinafter, used as a phase-locked loop.

The video demodulator 1 precedes a polarity inverter 2 which is controlled by a polarity detector 3 by means of a control signal. The polarity detector 3 receives the output signal from the polarity inverter 2, as well as a modulation-type signal MS indicating the type of demodulation of the IF video signal $V_{ZF}$.

The polarity inverter 2 precedes a video amplifier 4 whose DC gain is changeable in dependence upon the modulation-type signal MS. The DC value in the output signal of the amplifier 4 is thereby adjustable. The output of the video amplifier 4 supplies the output signal of the circuit arrangement according to the invention, i.e. the demodulated video signal in a desired polarity.

The input of the Costas loop 5 also receives the IF video signal $V_{ZF}$ which is applied to two mixers 6 and 7 in this loop.

The first mixer 6 precedes a first low-pass filter 8 which in its turn precedes a limiter 9 whose output signal is applied to a first multiplier 10. The output signal of the first multiplier 10 is applied to a loop filter 11 which precedes a controllable oscillator 12. A first output of the controllable oscillator 12 supplies a signal in the zero phase position, which signal is applied to the video demodulator 1. A second output 14 of the controllable oscillator supplies an output signal which is shifted 90° in phase with respect to the first input 1, which output signal is applied to the second mixer 7. The second mixer 7 precedes a second low-pass filter 15 whose output signal is applied to the first multiplier 10.

The fundamental operation of such a Costas loop is known from the publication mentioned hereinbefore. The first mixer 6, the first low-pass filter 8 as well as the limiter 9 constitute a so-called I branch in the Costas loop, whereas the second mixer 7 and the second low-pass filter 15 constitute a so-called Q branch. The Q branch is the one which operates as a normal PLL. The I branch supplies a signal which, as compared with the signal of the Q branch, occurs in quadrature. The voltage of the Q branch is thereby inverted in the first multiplier 10 whenever the polarity of the signal supplied by the Q branch is inverted. This occurs whenever the modulation changes sign, i.e. when the Costas loop operates at a working point offset of 180°. As a result, it is achieved with this construction of the Costas loop that this loop has stable working points with a 180° offset. The Costas loop can thus also further operate in a stable manner at the modulation frequency of an IF video signal applied thereto when the phase position of this modulation frequency jumps by 180° as a result of overmodulation. At such a jump, the Costas loop instantaneously locks in on the new, 180° offset phase position. No or, in any case, no essential transients occur. The effect occurs that the signal taken from the first output 13 of the controllable oscillator 12 and applied to the video demodulator 1 is 180° offset in its phase position with respect to the modulation signal during the periods of overmodulation.

The Costas loop further includes a third low-pass filter 16 and a second multiplier 17 receiving the output signal from the third low-pass filter 16 and that from the second low-pass filter 15 of the Q branch. The output signals of the second multiplier 17 and the first multiplier 10 are superimposed on each other by means of a superposition stage 18 and applied to the loop filter 11.

The elements 16 and 17 constitute a kind of frequency detector which is used for linking up the operating frequency of the Costas loop and hence also of the controllable oscillator 12 with these elements in the case of a relatively large frequency deviation with respect to the modulation frequency. In fact, it supplies a frequency-dependent signal which controls the operating frequency of the Costas loop in the case of a frequency deviation, independent of the phase position.

As described above, the Costas loop 5 may lock in on a working point with an offset of 180°. This has the result for the output signal of the video demodulator 1 that it has an unwanted polarity. This is to be avoided by the circuit arrangement according to the invention.

To this end, the polarity inverter 2 and the polarity detector 3 are provided. By means of the polarity inverter 2, the polarity of the demodulated video signal applied thereto can be inverted. This is effected in dependence upon the control signal which is supplied by the polarity detector 3. The polarity detector 3 determines the polarity of the output signal of the polarity inverter 2 and controls it in dependence upon the control signal in such a way that this output signal always has a desired polarity, for example, a negative polarity.

The output of the polarity inverter 2 then always supplies a demodulated video signal in the desired polarity.

The polarity of the output signal of the circuit arrangement and the polarity inverter 2 is thus independent of the fact on which of the two operating points offset by 180° the Costas loop 5 has locked in.

The circuit arrangement according to the invention shown in the embodiment of FIG. 1 is also suitable for processing IF video signals of different modulation types. Fundamentally, such signals may occur with a positive or negative modulation. In order to ensure also for such signals, which, dependent on the modulation type, have different polarities at the output of the video demodulator 1 and at the output of the polarity inverter 2, respectively, that the desired polarity prevails at the output, the polarity detector 3 receives a modulation-type signal MS indicating the modulation type. In dependence upon this signal, the polarity detector 3 takes the occurring modulation type into account when generating the control signal. It is thereby achieved that, independent of the type of modulation, the demodulated video signal at the output of the polarity inverter 2 always has a desired polarity.

Since these signals still have a different DC value due to their different modulation types, the modulation-type signal MS is further applied to an amplifier 4 which amplifies the output signal of the polarity inverter 2 by means of a DC gain which is adjustable in dependence upon the modulation-type signal MS, such that a video signal with approximately the same DC value always occurs at the output.

It is thus achieved that the circuit arrangement according to the invention always supplies a demodulated video signal of a desired polarity and with a fixed DC voltage, not only in the case of overmodulation but also in the case of IF video signals of different modulation types at the output and without any transient disturbances.

Figure 2:
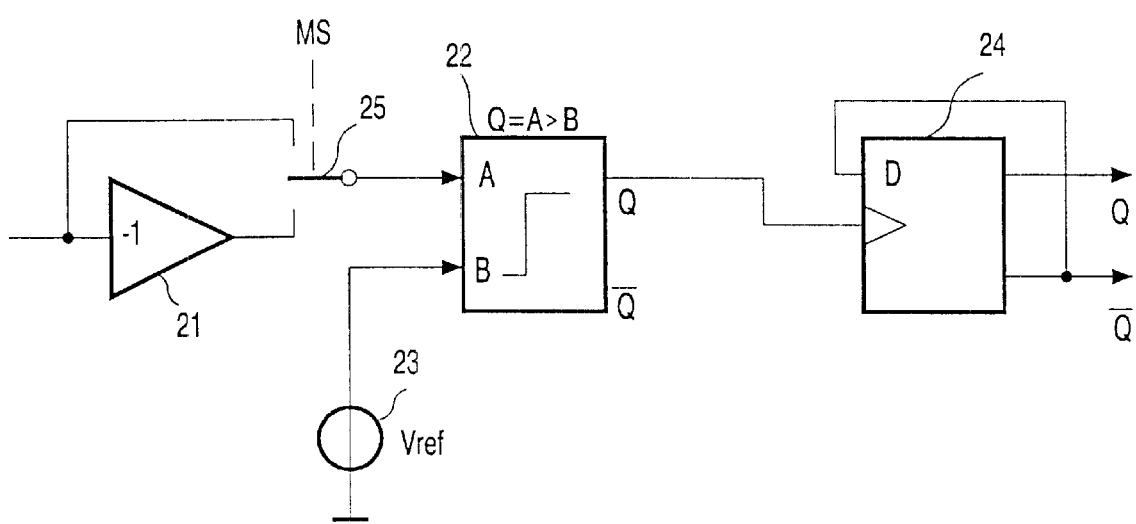
FIG. 2 is a block diagram of a polarity detector of the circuit arrangement shown in FIG. 1.

FIG. 2 shows in more detail circuit elements of the polarity detector 3 of the circuit arrangement shown in FIG. 1.

The output signal of the polarity inverter 2 of the arrangement shown in FIG. 1 is applied to an inverter 21 and to a switch 25 within the polarity detector 3 in the detailed representation in accordance with FIG. 2. This switch 25 is switched in dependence upon the modulation-type signal MS in such a way that it is switched to the output of the inverter 21 in the case of a positive modulation type of the IF video signal and to the input signal of the polarity detector in the case of a negative modulation type. The output signal of the polarity inverter 2 applied to the polarity detector 3 is thus inverted by means of the inverter 21 when the IF video signal has a positive modulation type. When it has a negative modulation type, the output signal of the polarity inverter 2 is not inverted.

The switch 25 precedes a comparator 22 whose input A receives the signal supplied by the switch 25. A second input B of the comparator 22 receives a comparison signal Vref which is supplied by a voltage source 23. The output Q of the comparator 22 then supplies an output signal when the signal available at its first input A and coming from the switch 25 is larger than the comparison signal Vref applied to its second input B.

The signal appearing at the Q output of the comparator 22 is applied to a circuit input of a subsequent D-flipflop 24 whose output signal Q' is fed back to the D-input of this D-flipflop 24. It is thereby achieved that the D-flipflop 24 changes its switching state when a low-high transient occurs in the output signal Q of the comparator 22, thus in the transient zone in which the comparator 22 determines that the input signal at its input A is larger than that at its input B.

The output signal Q of the D-flipflop 24 represents the control signal which is applied to the polarity inverter 2 in the circuit arrangement shown in FIG. 1.

It is thereby achieved that the control signal which is applied to the polarity inverter 2 always predetermines a change of the polarity of the polarity inverter 2 when the comparator 22 determines that the amplitude of the video signal exceeds the comparison signal Vref. When the value of the comparison signal is set in such a way that its value is only exceeded when a signal of the unwanted polarity occurs, then the object of the circuit arrangement according to the invention is achieved; in fact, the control signal is switched always at the wrong polarity of the demodulated video signal at the output of the polarity inverter 2, such that this output signal again has the desired polarity.

This will be further elucidated hereinafter with reference to some video signal sections shown as a function of time.

Figure 3:
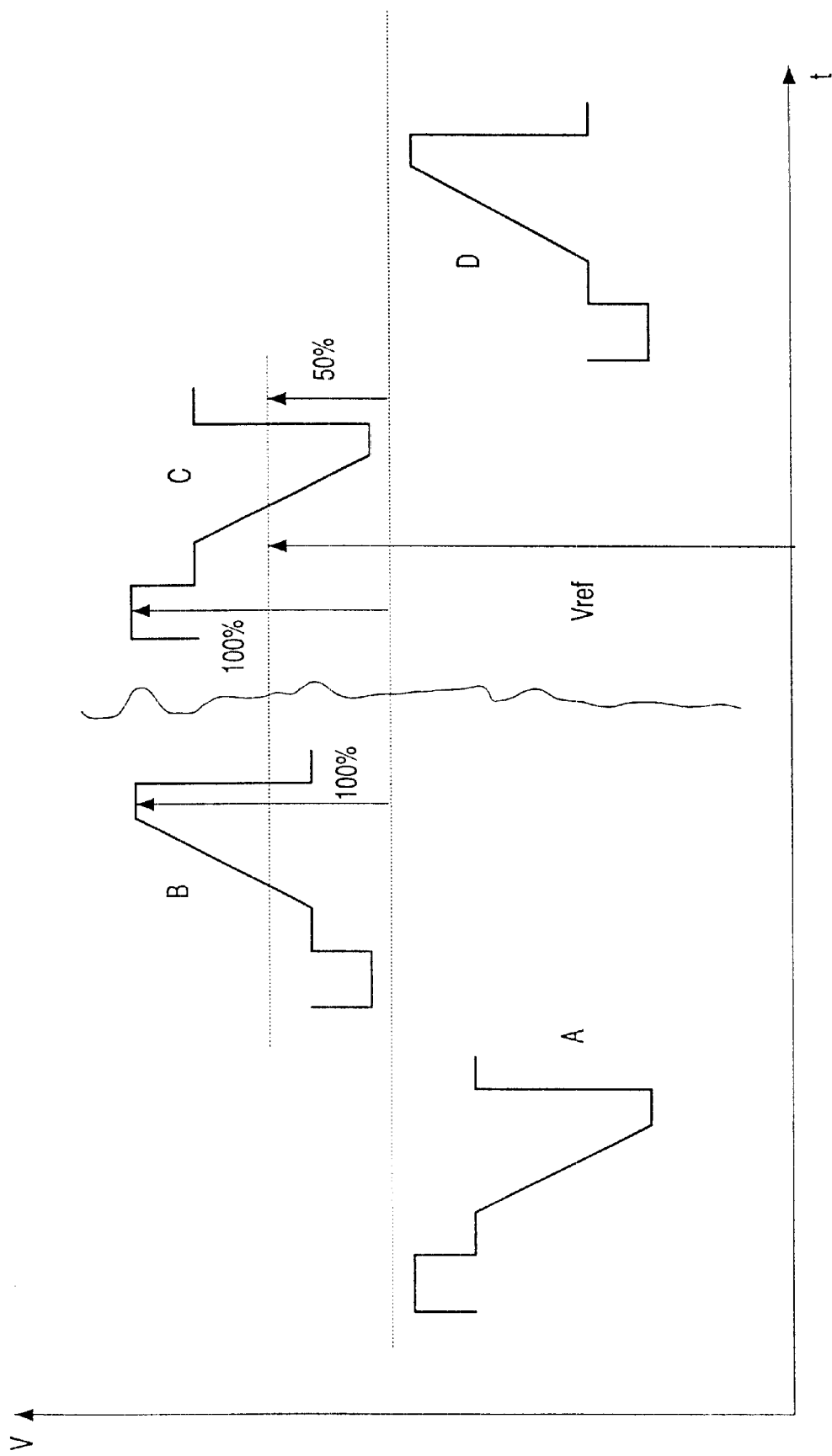
FIG. 3 shows demodulated video signals as a function of time to elucidate the operation of the polarity detector and the polarity inverter of the circuit arrangement of FIGS. 1 and 2, respectively.

FIG. 3 shows four oscillations A, B, C and D of demodulated video signals of different polarity and different modulation type. The oscillations A and B represent a demodulated video signal which was gained from an IF video signal with a positive modulation type. The oscillation A of the demodulated video signal shows how it may occur, for example, at the output of the video demodulator 1 or also at the polarity inverter 2 of the circuit arrangement of FIG. 1 (or at the input of the comparator 22 of FIG. 3). This oscillation shows a negative polarity in the desired manner.

For example, by locking in of the Costas loop 5 on a working point offset by 180°, the case may, however, occur that the demodulated video signal has an unwanted positive polarity, as is indicated in the oscillation B in FIG. 3.

FIG. 3 shows the comparison voltage Vref of the phase detector of FIG. 2. FIG. 3 shows that the oscillation of the video signal B, which has an unwanted polarity, exceeds the comparison signal Vref from time to time. In the arrangement of FIG. 2, this would result in a low-high transient in the output signal Q of the comparator 22, which in turn would result in a switch-over of the state of the D-flipflop 24. The control signal, which is applied to the polarity inverter 2 in the arrangement shown in FIG. 1, would then be switched accordingly. This in turn would result in a switch of the polarity inverter, inverting the polarity of the demodulated video signal applied thereto. After this switch-over, the video signal would again occur with the desired polarity in accordance with the oscillation A of FIG. 3 at the output of the polarity inverter 2. Due to the fact that the comparison voltage Vref is exceeded once, the oscillation B would thus trigger such a switch-over, which would have the result that the video signal would subsequently occur again with the desired polarity in accordance with oscillation A.

FIG. 3 further shows two oscillations C and D which represent demodulated video signals of an IF video signal in negative modulation.

Since the inverter 21 in the circuit arrangement according to FIG. 2 is only active at IF video signals which have a positive modulation type, the signals C and D, which originate from demodulated video signals of an IF video signal of the negative modulation type, occur in the inverted polarity. The oscillation D shows the demodulated IF video signal of the desired negative polarity of an IF video signal with a negative modulation. In contrast, the oscillation C shows a demodulated video signal of the unwanted positive polarity. Here again it holds that exceeding of the comparison voltage Vref by the signal of the oscillation C triggers a switch-over of the D-flipflop 24 and hence of the control signal supplied thereby so that the polarity inverter 2 inverts the demodulated video signal applied thereto so that the signal again occurs with the desired negative polarity in accordance with D.

It is achieved by the circuit arrangement according to the invention that the demodulated video signal supplied thereby always has a desired polarity without transient disturbances in the case of possible overmodulation occurring in the IF video signal. It is further independent of the fact on which of the two working points offset by 180° the Costas loop locks in. Moreover, an adaptation to the different modulation types of the IF video signal may even be realized so that the polarity of the supplied demodulated video signal is even independent of the modulation type.

What is claimed is:

1. A circuit arrangement for demodulating an intermediate-frequency video signal, comprising a video demodulator (1) and a phase-locked loop (5) formed as a Costas loop, in which an output signal of a controllable oscillator (12) arranged in the Costas loop and the intermediate-frequency video signal are coupled to the video demodulator (1), characterized in that a polarity inverter (2) is provided, which is preceded by the video demodulator (1) and by means of which the polarity of the demodulated video signal is invertable in dependence upon a control signal supplied by a polarity detector (3), and in that the polarity detector (3) determines the polarity of the output signal of the video demodulator (1) or of the polarity inverter (2) and, in dependence upon the determined polarity, controls the polarity inverter (2) by means of the control signal in such a way that the demodulated video signal at the output of the polarity inverter (2) has a predetermined polarity.

2. A circuit arrangement as claimed in claim 1, characterized in that the polarity detector (3) determines the polarity of the output signal of the polarity inverter (2).

3. A circuit arrangement as claimed in claim 1, characterized in that the polarity detector (3) controls the polarity inverter (2) in such a way that the output signal of the polarity inverter (2) has a negative polarity.

4. A circuit arrangement as claimed in claim 2, characterized in that the polarity detector (3) comprises a comparator (22) which supplies a pulse to a D-flipflop (24) when the value of the video signal supplied to said polarity detector exceeds the value of a comparison signal applied to the comparator (22), said D-flipflop changing, in response to said pulse, its switching state in dependence upon which the control signal is generated.

5. A circuit arrangement as claimed in claim 4, characterized in that the comparison voltage has approximately half the value of the voltage occurring at a maximum modulation in a video signal of the unwanted polarity.

6. A circuit arrangement as claimed in claim 1, characterized in that the polarity inverter (3) is formed as a multiplier.

7. A circuit arrangement as claimed in claim 1, characterized in that the arrangement receives a modulation-type signal indicating whether the video signal is modulated positively or negatively, and in that the polarity detector (3) generates the control signal while taking the modulation type into account.

8. A circuit arrangement as claimed in claim 4, characterized in that the video signal in the polarity detector (3) is applied to a switchable inverter (21; 25) which is controlled in dependence upon the modulation-type signal and whose output signal is coupled to the comparator (22), and in that the polarity inverter (2) precedes a video amplifier (4) whose DC gain is changeable in dependence upon the modulation-type signal.

9. A circuit arrangement as claimed in claim 4, characterized in that the value of the comparison voltage is changed in dependence upon the value of the modulation-type signal, and in that the polarity inverter (2) precedes a video amplifier (4) whose DC gain is changeable in dependence upon the modulation-type signal.

10. A circuit arrangement as claimed in claim 8, characterized in that the comparison voltage has a positive polarity, and in that the output signal of the polarity inverter (2), before being coupled to the comparator (22), is inverted by means of the switchable inverter (21) only when the modulation-type signal indicates a positively modulated video signal.

* * * * *